(12) United States Patent
Jeon

(10) Patent No.: US 9,329,669 B2
(45) Date of Patent: May 3, 2016

(54) POWER GATING CIRCUIT AND ELECTRONIC SYSTEM INCLUDING THE SAME

(71) Applicant: SAMSUNG ELECTRONICS CO., LTD., Suwon-Si, Gyeonggi-Do (KR)

(72) Inventor: Jae Han Jeon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/556,104

(22) Filed: Nov. 29, 2014

(65) Prior Publication Data

US 2015/0153818 A1    Jun. 4, 2015

(30) Foreign Application Priority Data

Dec. 4, 2013 (KR) .................. 10-2013-0149652

(51) Int. Cl.
| | |
|---|---|
| *H03K 19/23* | (2006.01) |
| *G06F 17/50* | (2006.01) |
| *G06F 1/32* | (2006.01) |
| *G06F 1/26* | (2006.01) |
| *G06F 1/18* | (2006.01) |
| *H03K 19/00* | (2006.01) |
| *H03K 19/0175* | (2006.01) |

(52) U.S. Cl.
CPC .............. *G06F 1/3287* (2013.01); *G06F 1/189* (2013.01); *G06F 1/26* (2013.01); *G06F 1/3203* (2013.01); *G06F 1/3243* (2013.01); *H03K 19/0016* (2013.01); *H03K 19/017581* (2013.01)

(58) Field of Classification Search
CPC .......... H03K 17/145; H03K 19/00361; H03K 17/167; H03K 19/0013; H03K 17/164; H03K 17/284; H03K 19/0016; H03K 19/0008; H03K 19/017581; H03K 2217/0036; H03K 3/012; G06F 1/3203; G06F 1/3296; G06F 2217/78; G06F 1/3287; Y02B 60/1278; G09G 2330/021

See application file for complete search history.

(56) References Cited

U.S. PATENT DOCUMENTS

| | | | |
|---|---|---|---|
| 7,183,825 B2 | 2/2007 | Padhye et al. | |
| 7,276,932 B2 | 10/2007 | Kuang et al. | |
| 7,609,047 B2 | 10/2009 | Ravichandran | |
| 8,248,156 B1 | 8/2012 | Wang et al. | |
| 8,362,805 B2 | 1/2013 | Suzuki et al. | |
| 8,373,493 B2 * | 2/2013 | Chakrabarty | H03K 17/167 327/404 |
| 8,395,440 B2 | 3/2013 | Sandhu et al. | |
| 8,421,499 B2 | 4/2013 | Takayanagi et al. | |
| 8,441,149 B2 | 5/2013 | Trivedi et al. | |
| 8,504,967 B2 * | 8/2013 | Suzuki | G06F 1/3287 716/120 |
| 8,659,316 B2 * | 2/2014 | Kim | H03K 19/0016 307/141 |
| 8,779,836 B2 * | 7/2014 | Takayanagi | H03K 19/0016 307/130 |
| 8,786,130 B1 * | 7/2014 | Mori | B81C 1/0023 307/38 |
| 8,786,309 B2 * | 7/2014 | Takayanagi | G06F 1/189 326/33 |
| 8,823,209 B2 * | 9/2014 | Tatsumi | G06F 1/3203 307/39 |
| 8,898,050 B2 * | 11/2014 | Lo | G06F 17/5036 703/14 |
| 9,059,696 B1 * | 6/2015 | Rahman | H03K 19/0013 |
| 2010/0269074 A1 | 10/2010 | Nation et al. | |

* cited by examiner

*Primary Examiner* — Vibol Tan
(74) *Attorney, Agent, or Firm* — Volentine & Whitt, PLLC

(57) ABSTRACT

A power gating circuit including a first chain buffer that generates a first sleep signal by buffering an input sleep signal, a second chain buffer that generates a second sleep signal by buffering the first sleep signal, and a first switch block including a plurality of first switch cells controlled according to the first sleep signal.

19 Claims, 11 Drawing Sheets

POWER GATING CIRCUIT AND ELECTRONIC SYSTEM INCLUDING THE SAME

CROSS-REFERENCE TO RELATED APPLICATIONS

This application claims the benefit of Korean Patent Application No. 10-2013-0149652 filed on Dec. 4, 2013, the disclosure of which is hereby incorporated by reference.

BACKGROUND

One or more aspects of the inventive concept relate to a power gating circuit and an electronic system including same.

A System-on-Chip (hereinafter referred to as 'SoC') is a technology-intensive semiconductor technique whereby the certain complicated systems having various functions may be integrated into a single "on-chip" system. A SoC typically includes a processor configured to control the system as well as various "intellectual properties" or "IPs" controlled by the processor. Here, the term 'IP' denotes one or more circuit(s), logic element(s), and/or combination(s) of same commonly integrated on a semiconductor fabrication layout that implemented the SoC. Programming code may be stored in one or more circuit(s) of the SoC.

Mobile devices including a SoC having multiple IPs operate us battery-supplied power, and therefore must be designed when power conservation in mind. So-called "power-gating" is a technique used to decrease power consumption in certain mobile devices. Power-gating essentially blocks current consumption by an IP when it is not currently in use.

Power-gating may be performed by arranging a plurality of switch cells in each IP and controlling the plurality of switch cells with a control signal. A high fanout net (HFN), a daisy chain method, a fishbone method, and the like may be used to generate the control signal. Among these methods, a final acknowledgement (ACK) signal is difficult to generate when the HFN or the fishbone method is used in contrast with the daisy chain method. Thus, the daisy chain method is commonly used. However, in the daisy chain method, one buffer is typically configured with each switch cell, and thus leakage consumption is high due to the relatively large number of buffers as compared to implementations wherein the HFN is used.

SUMMARY

According to an aspect of the inventive concept, a power gating circuit configured to perform power gating of an element comprises; a first chain buffer that generates a first sleep signal by buffering an input sleep signal received from a power management unit, and a first switch block including a plurality of first switch cells controlled by the first sleep signal, and a second chain buffer that generates a second sleep signal by buffering the first sleep signal, and a second switch block including a plurality of second switch cells controlled by the second sleep signal, wherein the second sleep signal is returned to the power management unit as an acknowledge signal indicating completion of the power gating of the element.

According to another aspect of the inventive concept, a power gating circuit configured to perform power gating of an element comprises; a first chain buffer that generates a first sleep signal by buffering an input sleep signal received from a power management unit and a first switch block that receive the first sleep signal, and a second chain buffer that generates a second sleep signal by buffering the first sleep signal and a second switch block that receive the second sleep signal. The first switch block comprises a first drive buffer configured to generate a third sleep signal by buffering the first sleep signal and a plurality of first switch cells that receives the third sleep signal. The second switch block comprises a second drive buffer configured to generate a fourth sleep signal by buffering the second sleep signal and a plurality of second switch cells that receives the fourth sleep signal. The second sleep signal is returned to the power management unit as an acknowledge signal indicating completion of the power gating of the element.

BRIEF DESCRIPTION OF THE DRAWINGS

Certain embodiments of the inventive concept will be more clearly understood upon consideration of the following written description taken in conjunction with the accompanying drawings in which.

DETAILED DESCRIPTION

Embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
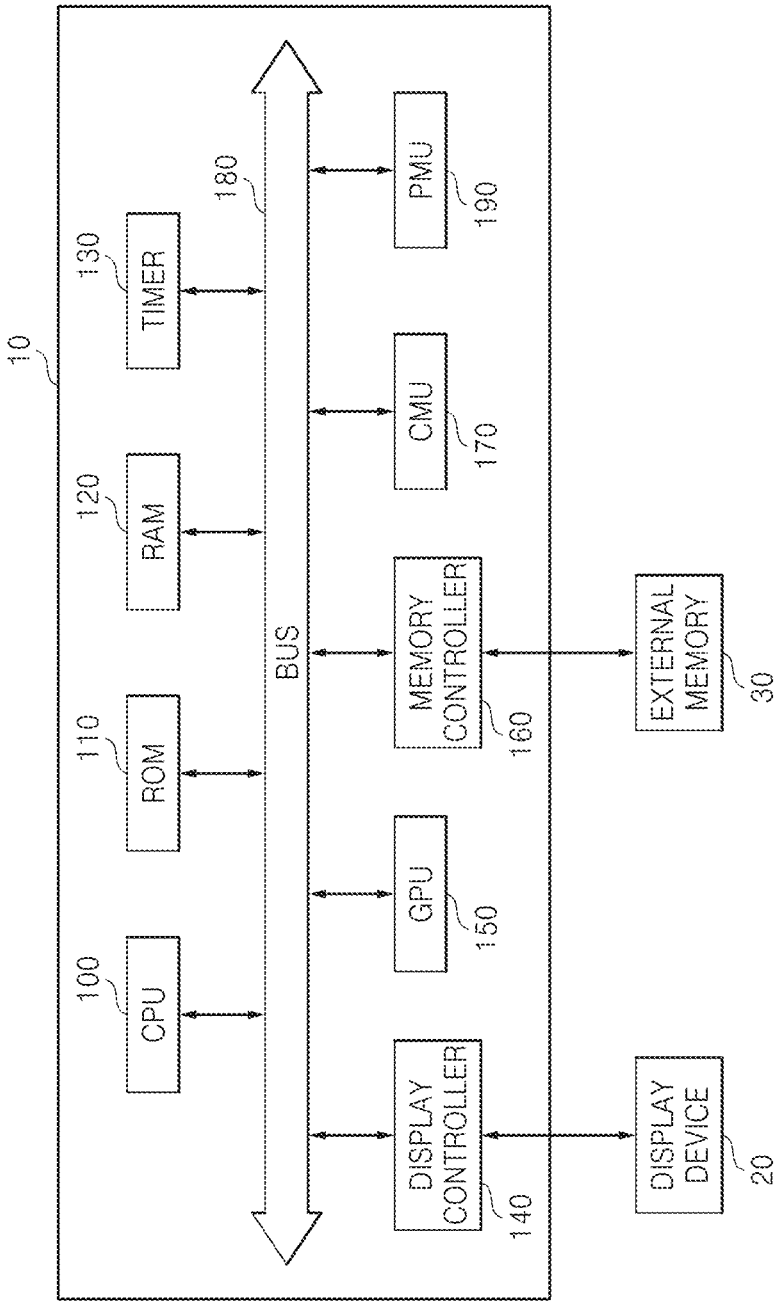
FIG. 1 is a block diagram illustrating an electronic system according to an embodiment of the inventive concept.

FIG. 1 is a block diagram of an electronic system 1 according to an embodiment of the inventive concept.

Referring to FIG. 1, the electronic system 1 may be embodied as (or as part of) a mobile phone, a smart phone, a tablet personal computer (PC), a personal digital assistant (PDA), an enterprise digital assistant (EDA), a digital still camera, a digital video camera, a portable multimedia player (PMP), a personal/portable navigation device (PND), a handheld game console, or a handheld device such as e-book.

The electronic system 1 generally comprises a system-on-chip (SoC) 10, an external memory 30, and a display device 20.

The SoC 10 comprises a plurality of intellectual properties (IPs), for example, a central processing unit (CPU) 100, a read only memory (ROM) 110, a random access memory (RAM) 120, a timer 130, a display controller 140, a graphics processing unit (GPU) 150, a memory controller 160, a clock management unit (CMU) 170, and a bus 180.

The SoC 10 may further include some additional IPs. For example, although not shown in FIG. 1, the SoC 10 may further comprise a multi-format codec (MFC), a video module (e.g., a camera interface, a Joint Photographic Experts Group (JPEG) processor, a video processor, a mixer, etc.), an audio system, a driver, a volatile memory device, a non-volatile memory device, a cache memory, a serial port, an analog-to-digital converter, etc.

The SoC 10 illustrated in FIG. 1 also comprises an internally-disposed power management unit (PMU) 190. However, those skilled in the art will appreciate that the PMU 190 may be externally disposed relative to the SoC 10.

The PMU 190 may be variously connected to the constituent elements of the SoC 10 (e.g., elements 100, 110, 120, 130, 140, 150 160 and 170 (or "elements 100 through 170"), noted above) in order to provide one or more appropriate power supply voltage(s). For example, the PMU 190 may be used to provide one or more controlled power supply voltage(s) to the elements 100 through 170 using one or more techniques, such as dynamic voltage frequency scaling (DVFS), clock gating, and/or power gating.

The CPU 100 (or "processor") may be used to receive and process externally provide commands/instructions that control the execution of various data access operations (e.g., read, write (or program), and erase) directed the external memory 30. The CPU 100 may also be used to control the execution of certain housekeeping operations associated with the SoC 10 and/or external memory 30. Thus, the CPU 100 may control the execution of certain operations synchronously performed in relation to one or more clock signal(s) provided by the CMU 170.

In certain embodiments of the inventive concept, the CPU 100 may be embodied as a multi-core processor, where the term "multi-core processor" is used to denote a class of unitary (single chip) computational elements including two or more independently operated processors (or processing cores, or 'cores'), each capable in the context of the embodiment illustrated in FIG. 1 of controlling the execution of a data access operation in response to corresponding commands/instructions.

The execution of program commands/instruction by the CPU 100 may involve reading certain "programming information" (e.g., code) stored in the ROM 110, RAM 120, and/or external memory 30. Further, "data" either generated by, related to, or communicated nu execution of programming information by the CPU 100 may be variously stored in the ROM 110, RAM 120 and/or the external memory 30.

Thus, the ROM 110 may be used to store programming information and/or related data in a nonvolatile manner. Here, the ROM 110 may be embodied, for example, as an erasable programmable read-only memory (EPROM) or an electrically erasable programmable read-only memory (EEPROM) or flash memory.

The RAM 120 may be used to temporarily store programming information and/or data. For example, programming information (e.g., code) and/or data initially stored in the ROM 110 or the external memory 30 may be moved and temporarily stored in the RAM 120 under control of the CPU 100 in response to execution of booting code stored in the ROM 110. The RAM 120 may be embodied as a dynamic RAM (DRAM) or a static RAM (SRAM).

The timer 130 may be used to generate a count value variously used as a timing signal by one or more of the elements 100 through 170 time. In certain embodiments, count value or derived timing signal will be generated in response to one or more clock signal(s) provided by the CMU 170.

The GPU 150 may be used to transform data—such as data read from the external memory 30 by the memory controller 160—into one or more data signals appropriately defined in relation to the display device 20.

As previously noted, the CMU 170 may be used to generate one or more clock signal(s). In certain embodiments, the CMU 170 will include a clock signal generation device, such as a phase locked loop (PLL), a delayed locked loop (DLL), or a crystal oscillator.

One or more of the clock signals generated by the CMU 170 may be provided to the GPU 150, CPU 100, memory controller 160, and/or other elements of the SoC 10. In certain embodiments, at least one of the one or more clock signals generated by the CMU 170 will be variable in its frequency.

The memory controller 160 serves as an interface between the SoC 10 and the external memory 30 and may be used to control the overall operation of the external memory 30 and the exchange of data between a host (not shown), the SoC 10, and the external memory 30. For example, the memory controller 160 may be used to control the specific execution of read, write (or program) and erase operations directed to the external memory 30 in response to a request received from the host. Here, the host may be a master device similar to the CPU 100, GPU 150, and/or display controller 140.

The external memory 30 may take many different forms as a storage medium for data provided by the SoC 10. Data may be read from, erased from, and/or written or programmed to the external memory 30 in response to commands/instructions generated by an operating system (OS), various application programs, and/or various data. The external memory 30 may be implemented, wholly or in part, as a volatile memory (e.g., one or more DRAM), but might also be implemented, wholly or in part, as a nonvolatile memory (e.g., a flash memory, phase-change RAM (PRAM), magnetic RAM (MRAM), resistive RAM (RRAM), ferroelectric RAM (FeRAM), embedded multimedia card (eMMC), universal flash storage (UFS) etc.). In certain embodiments of the inventive concept, the external memory 30 will be implemented as a "built-in memory" of the SoC 10.

The elements 100 through 170 are configured to communicate with one another via the bus 180.

The display device 20 may be variously configured to display images in response to received image data signals provided (e.g.,) by the display controller 140, where the display controller 140 is used to control the overall operation of the display device 20. In various embodiments, the display device 20 may a liquid crystal display (LCD), light emitting diode (LED) display, organic LED (OLED) display, active-matrix OLED (AMOLED) display, flexible display, etc.

Hereafter, certain exemplary embodiments of the inventive concept will be described in the context of a power-gated by the PMU 190 version of the GPU 150. However, this is just one example. Those skilled in the art will recognize form the novel teaching of the subject application that any one or more of the IPs 100, 110, 120, 130, 140, 160, and 170 might be similarly power-gated by the PMU 190.

Figure 2:
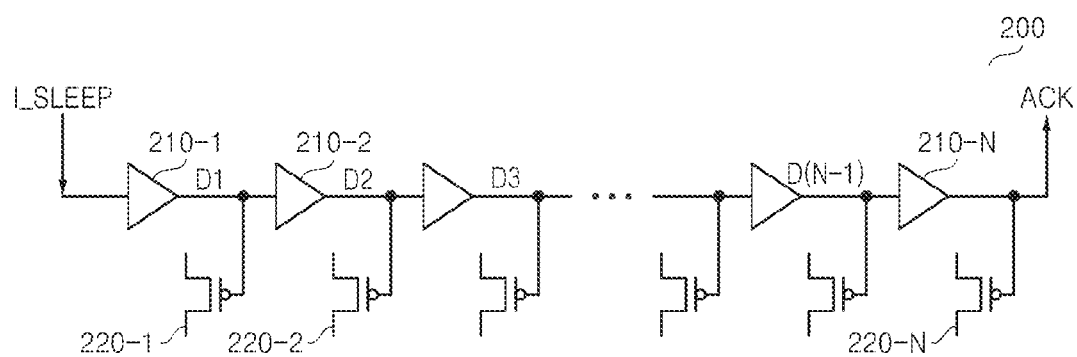
FIG. 2 is a circuit diagram illustrating a power gating circuit having a daisy chain structure.
Figure 3:
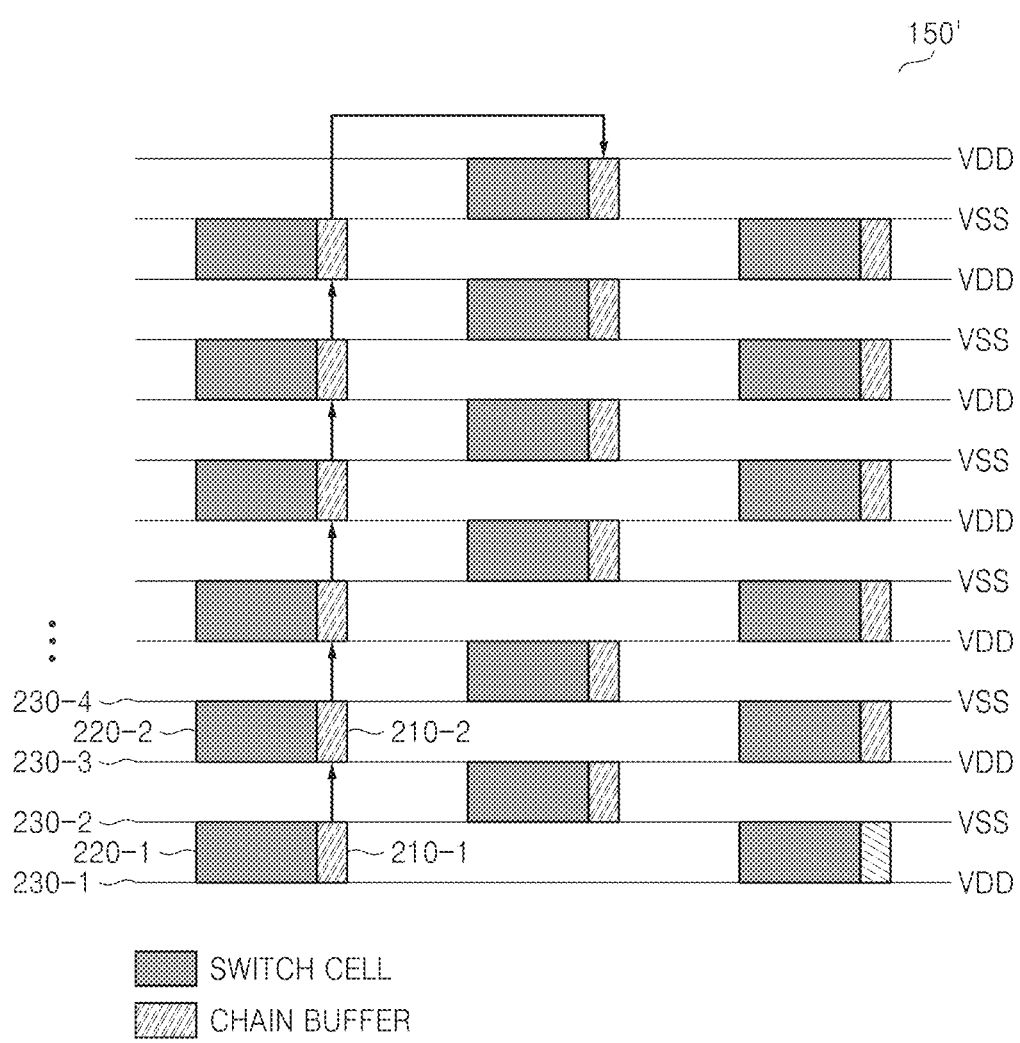
FIG. 3 is a layout diagram illustrating an intellectual property (IP) including the power gating circuit of FIG. 2.

FIG. 2 is a circuit diagram illustrating by way of a comparative example a power gating circuit 200 having a daisy chain structure, and FIG. 3 is a layout diagram of an IP including the power gating circuit 200 of FIG. 2.

Thus, referring to FIGS. 2 and 3, GPU 150' is assumed to include the power gating circuit 200 of FIG. 2. The power gating circuit 200 receives an input sleep signal (I_SLEEP). In some aspects, the input sleep signal will be provided by a related power management unit.

The input sleep signal is essentially a type of control signal that blocks power from being supplied by (e.g.,) a power management unit to an associated element (e.g., GPU 150'). Thus, according to one set of signal definitions, a logically "high" input sleep signal will enable a supply power to the GPU 150', while a logically "low" input sleep signal will disable the supply.

In FIG. 2, the power gating circuit 200 includes series-connected first through Nth buffers (e.g., a first buffer 210-1 through an $N^{th}$ buffer 210-N), where 'N' is a natural number greater than 1. The first buffer 210-1 through the N-1$^{th}$ buffer 210-(N-1) respectively output first sleep signal (D1) through (N-1)$^{th}$ sleep signal (D(N-1)), while the $N^{th}$ buffer 210-N outputs a final sleep signal (ACK), where the final sleep signal is output to a power management unit to indicate whether the power gating of the GPU 150 is complete. The power gating circuit 200 of FIG. 2 further includes first switch cell 220-1 through $N^{th}$ switch cell 220-N, respectively associated with each one of first buffer 210-1 through $N^{th}$ buffer 210-N.

With reference to FIG. 3, it is assumed that the GPU 150' includes a plurality of power rails (230-1, 230-2, etc.), and that each one of the power rails is formed from a metal or similar conductive material(s). A first reference voltage (VDD) and a second reference voltage (VSS) are alternately applied to opposing ends of the power rails. (The GPU 150' might also include a power mesh (not shown) capable of receiving external power). With this configuration, each one of a plurality of switch cells 220-1 to 220-N may control an electrical connection between the power mesh and one of the power rails.

In one specific arrangement, each of the first switch cell 220-1 through $N^{th}$ switch cell 220-N is formed by P-type Metal Oxide Semiconductor (PMOS) transistor that is capable of selectively connecting the power mesh with odd-numbered power rails (e.g., 230-1, 230-3, etc.).

For example, a source and drain of the first switch cell 220-1 may be connected to the power mesh and the first power rail 230-1, respectively, and the first sleep signal D1 may be supplied to a gate of the first switch cell 220-1. Thus, external power received via the power mesh will not supplied to the first power rail 230-1 of the GPU 150' when the first sleep signal D1 is high, but will be supplied to the first power rail 230-1 of the GPU 150' when the first sleep signal D1 is low.

In another specific arrangement, each of the first switch cell 220-1 to the $N^{th}$ switch cell 220-N is formed by an N-type MOS (NMOS) transistor that is capable of selectively connecting the power mesh with even-numbered power rail (e.g., 230-2, 230-4, etc.).

The semiconductor substrate area existing in a gap between adjacent power rails (e.g., the first power rail 230-1 and second power rail 230-2) in the foregoing arrangement are commonly referred to as a cell rows. A plurality of standard cell libraries (not shown) may be disposed in the cell rows, where the standard cell libraries have the same height and may include various elements such as logic gates, inverters, buffers, etc. An application-specific integrated circuit (ASIC) may be designed by connecting the plurality of standard cell libraries.

Thus, in the daisy chain structure described above, small-sized buffers may be used to reduce leakage. That is, since leakage is generally proportional to buffer size, a relatively smaller buffer will result in less leakage. However, assuming a relatively large-sized buffer by way of comparison, the corresponding maximum capacitance that an associated output pin is capable of driving is also large. Thus, a relatively large-sized buffer may effectively be used to drive a large number of fan-outs. Accordingly, if it is assumed that the number of switches to be connected remains the same, the total area and total amount of leakage may be relatively reduced for cases where a large number of switches is connected to a large-sized buffer, as compared with cases where the same number of switches is connected to small-sized buffers.

Figure 4:
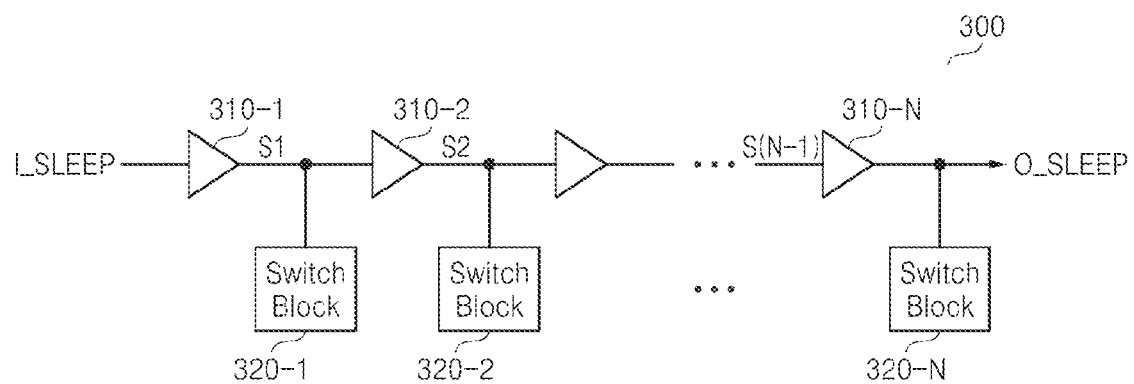
FIG. 4 is a logic diagram illustrating in one example a power gating circuit according to certain embodiments of the inventive concept.

FIG. 4 is a logic diagram illustrating a power gating circuit 300 according to an embodiment of the inventive concept.

Referring to FIGS. 1 and 4, the power gating circuit 300 comprises a chain of buffers (e.g., first chain buffer 310-1 through $N^{th}$ chain buffer 310-N), wherein each buffer in the chain of buffers is operationally associated with a respective switch block (e.g., first switch block 320-1 through $N^{th}$ switch block 320-N. Here, each of the plurality of switch blocks is assumed to include two or more switch cells.

The first chain buffer 310-1 of the chain of buffers shown in FIG. 4 receives an input sleep signal (I_SLEEP) from a corresponding power management unit (e.g., the PMU 190 of FIG. 1), and in response, generates a first sleep signal (S1) by buffering the input sleep signal I. From here, and as will be appreciated from FIG. 4, each $K^{th}$ chain buffer 310-K disposed between the first chain buffer 310-1 and the (last) $N^{th}$ chain buffer 310-N will receive a sleep signal generated by a preceding chain buffer (a $K^{th}$-1 sleep signal) S(K-1)), and will in response, generate a corresponding $K^{th}$ sleep signal (SK), where 'K' ranges from 2 to N-1. In this manner, the $N^{th}$ chain buffer 310-N will ultimately generate a final sleep signal (O_SLEEP) that is provided to the PMU 190 as a feedback signal indicating that the power gating of the GPU 150 is complete.

The plurality of switch cells included in each of the first switch block 320-1 through $N^{th}$ switch block 320-N may be controlled according to a respective first through $N^{th}$ sleep signals (S1 through O_SLEEP), and may be variously configured from PMOS and/or NMOS transistors.

With this configuration, the power gating circuit 300 may have a grid type switch cell array structure. That is, the switch cells of the power gating circuit 300 may be arranged in cell rows that are spaced apart by a predetermined distance from one another, like (e.g.,) the arrangement shown in FIG. 3.

In one specific embodiment of the inventive concept, the power gating circuit 300 will have a ring type switch cell array structure. That is, the switch cells of the power gating circuit 300 may be arranged to surround one or more edge(s) of a particular IP layout.

Figure 5:
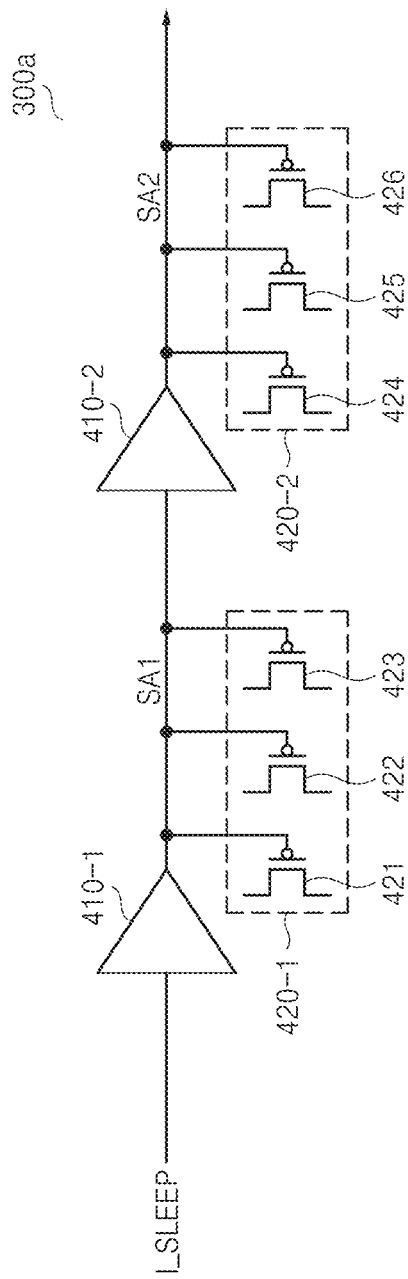
FIG. 5 is a logic diagram further illustrating in one example the power gating circuit of FIG. 4.
Figure 6:
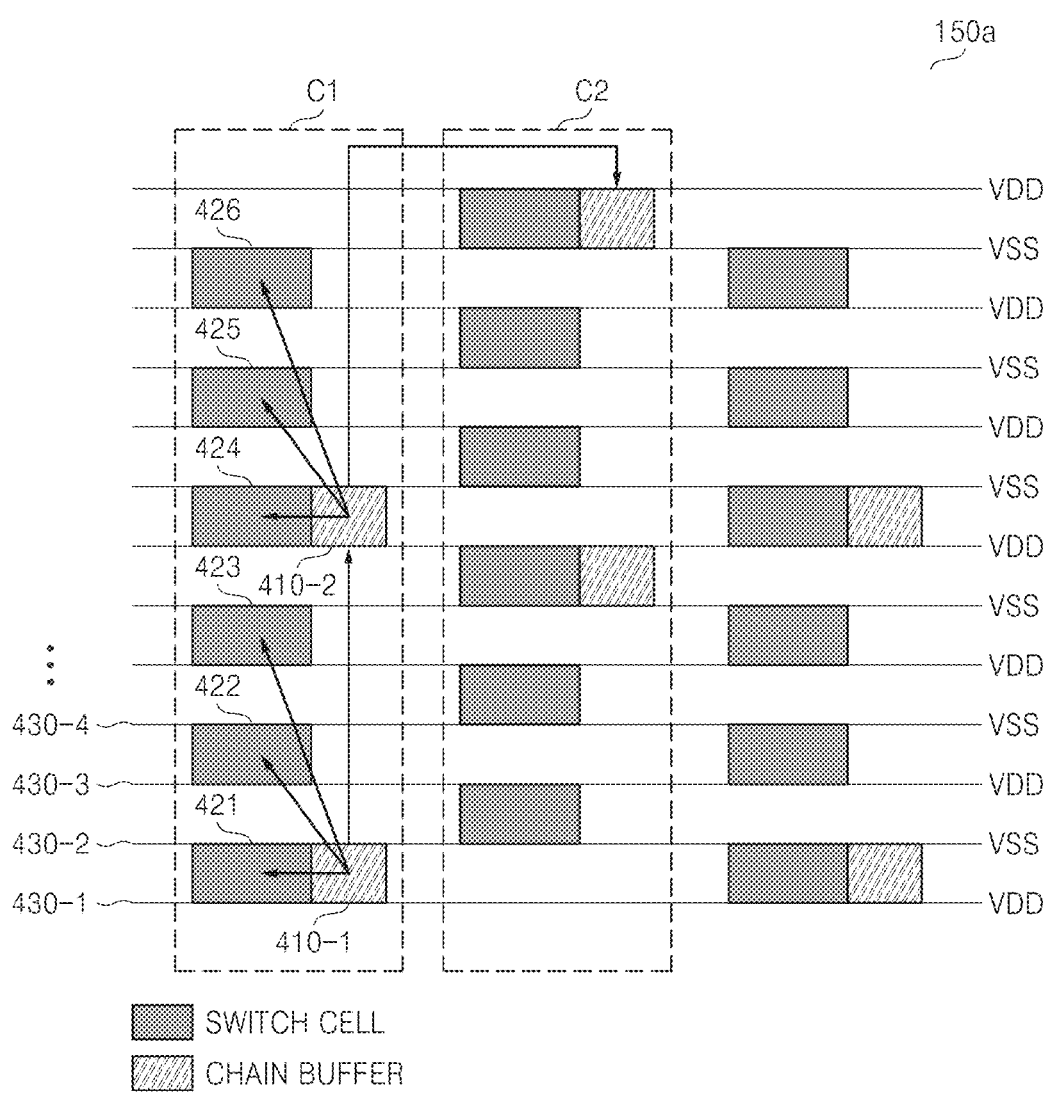
FIG. 6 is a layout diagram illustrating an IP including the power gating circuit of FIG. 5.

FIG. 5 is a logic diagram further illustrating in one example (300a) the power gating circuit 300 of FIG. 4. FIG. 6 is a layout diagram of an IP including the power gating circuit 300a of FIG. 5.

Referring to FIGS. 1, 5, and 6, an IP, e.g., a GPU 150a, is assumed to include the power gating circuit 300a.

Here, the power gating circuit 300a includes a first chain buffer 410-1, a second chain buffer 410-2, a first switch block 420-1, and a second switch block 420-2. Although any reasonable number ('N') of chain buffers and switch blocks may be used in various embodiments of the inventive concept, FIG. 5 show only two (2) each of such for the sake of brevity of description.

The first switch block 420-1 includes three (3) switch cells 421, 422 and 423, and the second switch block 420-2 similarly includes three (3) switch cells 424, 425 and 426. However, any reasonable number of switch cells greater than 1 switch cell may be used in a switch block incorporated in an embodiments of the inventive concept. Further, the number of switch cells need not be the same as between respective switch blocks arranged in a power gating circuit consistent with embodiments of the inventive concept.

With reference to FIG. 6, the GPU 150a again includes a plurality of metal (or conductive) power rails (e.g., 430-1, 430-2, etc.). A first reference voltage (VDD) and a second reference voltage (VSS) may applied to alternate (odd/even) power rails. Gaps between adjacent power rails (e.g., a first power rail 430-1 and a second power rail 430-2) will be referred to as "cell rows". Here again, a plurality of standard cell libraries may be disposed in cell rows.

The GPU 150a of FIG. 6 further includes a power mesh 6 that may be variously configured to receive external power, where the first and second switch blocks 520-1 and 520-2 (and constituent switch cells 421 through 426) may be used to control various electrical connection(s) between the power mesh and one or more power rails 430-1, 430-2, etc.

The GPU 150a may be further understood as including a plurality of column regions C1, C2, etc., wherein the switch cells 421 through 426 of the first and second switch blocks 520-1 and 520-2 are arranged in a columnar relationship at predetermined intervals.

In certain embodiments of the inventive concept, a particular set of switch cells (e.g., 421 through 426) may be arranged in an aligned pattern (the direction of 'alignment' being arbitrarily defined) within a column region (e.g., C1). In other embodiments of the inventive concept, the particular set of switch cells (e.g., 421 through 426) may be arranged in a staggered pattern across two adjacent column regions (C1 and C2).

The first chain buffer 410-1 may be used to receive an input sleep signal (I_SLEEP) from the PMU 190, and in response, to generate a first sleep signal SA1 by buffering the input sleep signal. Thus, the first chain buffer 410-1 will output the first sleep signal SA1 in accordance with the ON/OFF transistor state(s) of the switch cells 421, 422 and 423. In similar manner, the second chain buffer 410-2 may be used to generate a second sleep signal SA2 by buffering the first sleep signal SA1 in accordance with the ON/OFF transistor states of the switch cells 424, 425 and 426.

Thus, as illustrated in the example of FIG. 6, the first chain buffer 410-1 may be disposed adjacent to one of its switch cells (e.g., 421) and proximate to its other switch cells (e.g., 422 and 423), while the second chain buffer 410-2 may be disposed adjacent to one of its switch cells (e.g., 424) and proximate to its other switch cells (e.g., 425 and 426). However, other dispositional arrangements relative to chain buffers and associated switch cells may be made.

In certain embodiments of the inventive concept, the first chain buffer 410-1 and the second chain buffer 410-2 may have a larger size each one of the first buffer 210-1 through $N^{th}$ buffer 210-N of FIG. 2 so as to better drive a plurality of switch cells.

That is, the more switch cells included in each respective switch block, the greater the output load on the preceding buffer. And when an output loads are relatively high, a maximum transition time violation (MTTV) may occur with respect to the second sleep signal SA2 in a cascade of related sleep signals. Thus, in order to ensure stable operation of a power gating circuit according to an embodiment of the inventive concept, the number of switch cells included in each one of a plurality of daisy-chained switch blocks should be set according to MTTV possibilities, where the MTTV such possibilities are defined in accordance with a standard cell library, and may be related to the slope of an input signal of a switch cell when the input signal transitions from logical high to low, or from logical low to high.

Figure 7:
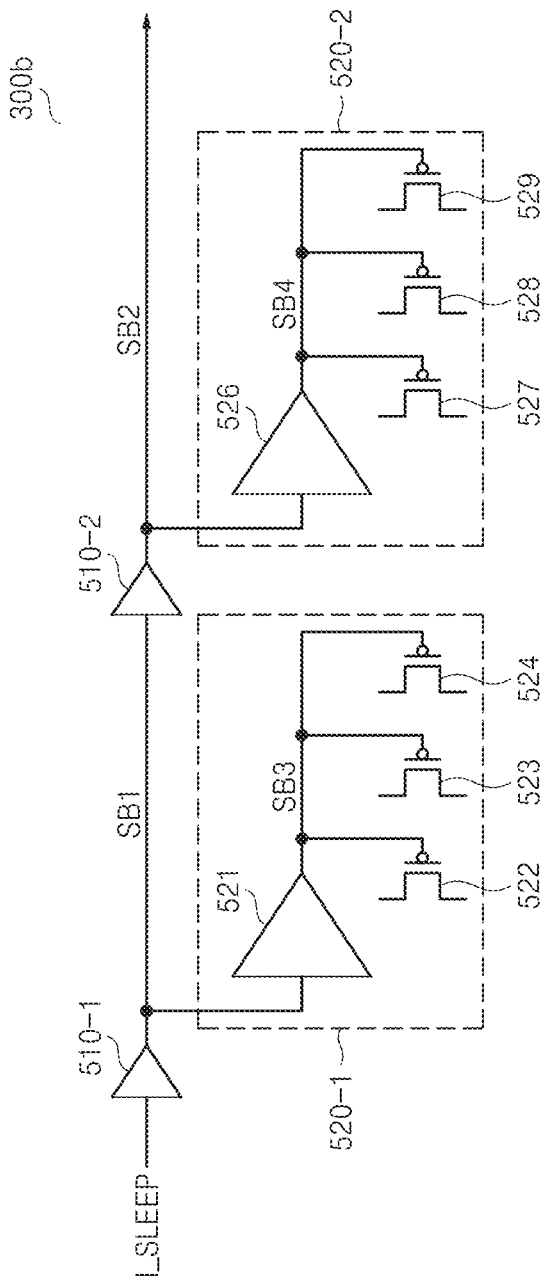
FIG. 7 is a logic diagram illustrating in another example the power gating circuit of FIG. 4.
Figure 8:
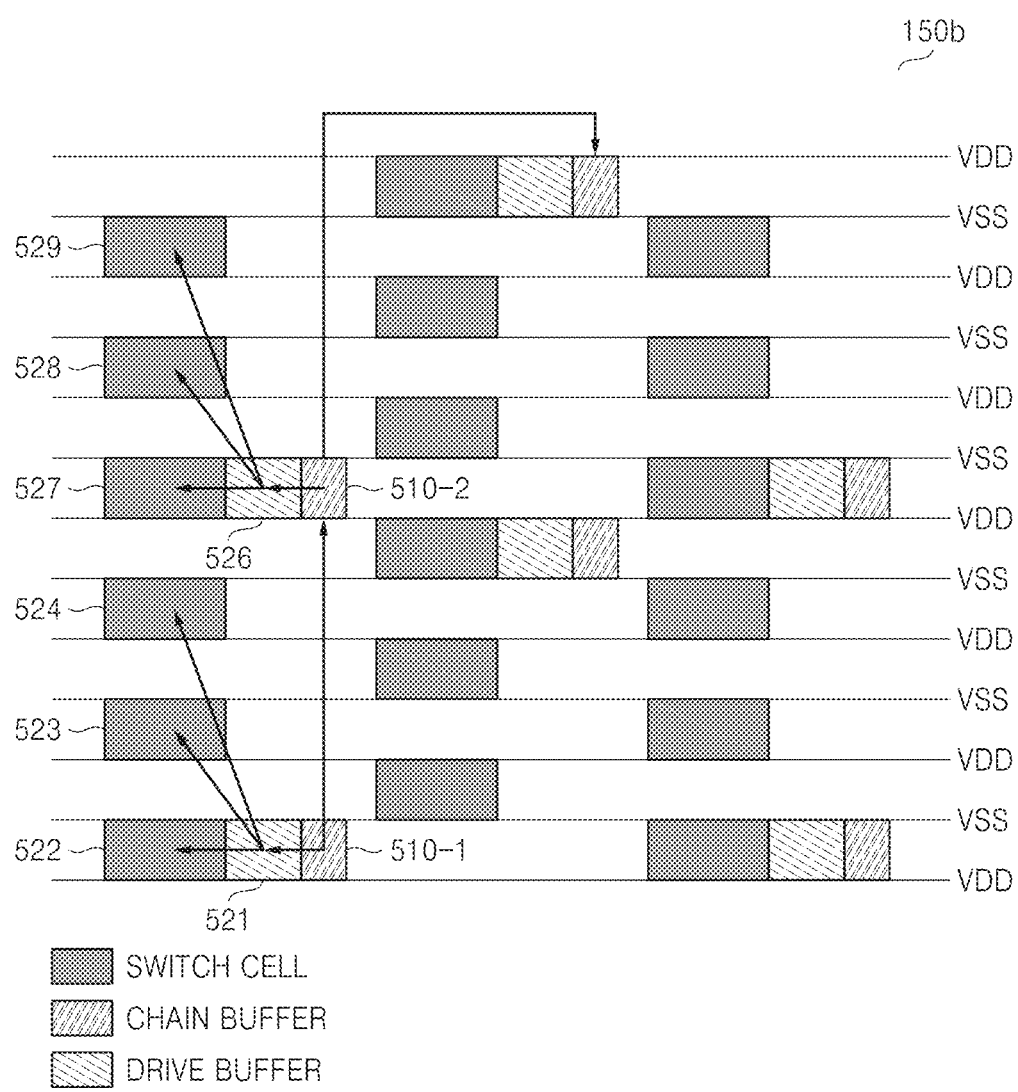
FIG. 8 is a layout diagram of an IP including the power gating circuit of FIG. 7.

FIG. 7 is a logic diagram further illustrating in another example (300b) the power gating circuit 300 of FIG. 4, and FIG. 8 is a layout diagram of an IP including the power gating circuit 300b of FIG. 7. The structures of the power gating circuit 300b of FIG. 7 and the IP of FIG. 8 are substantially the same as those of the power gating circuit 300a of FIG. 5 and the IP of FIG. 6 with certain exceptions discussed in detail hereafter.

Referring to FIGS. 1, 7, and 8, the power gating circuit 300b comprises a first chain buffer 510-1, a second chain buffer 510-2, a first switch block 520-1, and a second switch block 520-2. Here again, the first chain buffer 510-1 receives the input sleep signal (I_SLEEP) from the PMU 190, and generate the a first sleep signal SB 1 by buffering the input sleep signal. Thus, the first chain buffer 510-1 outputs the first sleep signal SB 1 to the first switch block 520-1 and the second chain buffer 510-2.

The second chain buffer 510-2 similarly generates a second sleep signal SB2 by buffering the first sleep signal SB1, and outputs the second sleep signal SB2 to the second switch block 520-2 and the PMU 190, assuming only two (2) chain buffers and two (2) switch blocks in the illustrated example.

The first switch block 520-1 includes a first drive buffer 521 and a plurality of first switch cells 522, 523 and 524, and the second switch block 520-2 includes a second drive buffer 526 and a plurality of second switch cells 527, 528 and 529.

The number of the first switch cells 522 to 524 and the number of the second switch cells 527 to 529 may be the same or different from each other.

The first drive buffer 521 generates a third sleep signal SB3 by buffering the first sleep signal SB1, and output the third sleep signal SB3 to the first switch cells 522 to 524.

The second drive buffer 526 may generate a fourth sleep signal SB4 by buffering the second sleep signal SB2, and output the fourth sleep signal SB4 to the second switch cells 527 to 529.

The first drive buffer 521 may be disposed adjacent to one of the first switch cells 522 to 524, and the first chain buffer 510-1 may be disposed adjacent to the first drive buffer 521. The second drive buffer 526 may be disposed adjacent to one of the second switch cells 527 to 529, and the second chain buffer 510-2 may be disposed adjacent to the second drive buffer 526.

In order to drive the first switch cells 522 to 524, the size of the first drive buffer 521 may be larger than that of the first chain buffer 510-1, and in order to drive the second switch cells 527 to 529, the size of the second drive buffer 526 may be larger than that of the second chain buffer 510-2

The size of the first drive buffer 521, the size of the first chain buffer 510-1, and the number of the first switch cells 522 to 524 may be set according to an available wire capacity of each particular layout as well as the capacity of the first switch cells 522 to 524.

In this context, the term "wire capacity" may be understood as the capacity of a wire connected between the first drive buffer 521, the first chain buffer 510-1, and the first switch cells 522 to 524. The capacity of the first switch cells 522 to 524 may be a capacity between a gate, drain, source, and body of a transistor when the first switch cells 522 to 524 are each embodied as, for example, a transistor.

As the number of the first switch cells 522 to 524 increases, the distance between the first chain buffer 510-1 and the second chain buffer 510-2 increases on a layout, thereby increasing the capacity of a wire connecting the first chain buffer 510-1 and the second chain buffer 510-2. Thus, the size of the first chain buffer 510-1 may be set according to the number of the first switch cells 522 to 524. For example, the greater the number of the first switch cells 522 to 524, the greater the size of the first chain buffer 510-1 may be set.

According to the embodiment described above, the possibility of MTTV may be reduced by adjusting the slopes of the first and second sleep signals SB1 and SB2 using the first and second chain buffers 510-1 and 510-2, where the second sleep signal SB2 may be used as a final sleep signal SB2 (or ACK) indicating completion of power gating for the GPU 150b. Also, the total number of buffers may be reduced by connecting a plurality of switches using the first and second drive buffers 521 and 526. Also, since the number of buffers connected in series may be less than when a standard daisy chain arrangement is used, the time required to generate the final sleep signal SB2 (or ACK) may be decreased.

Figure 9:
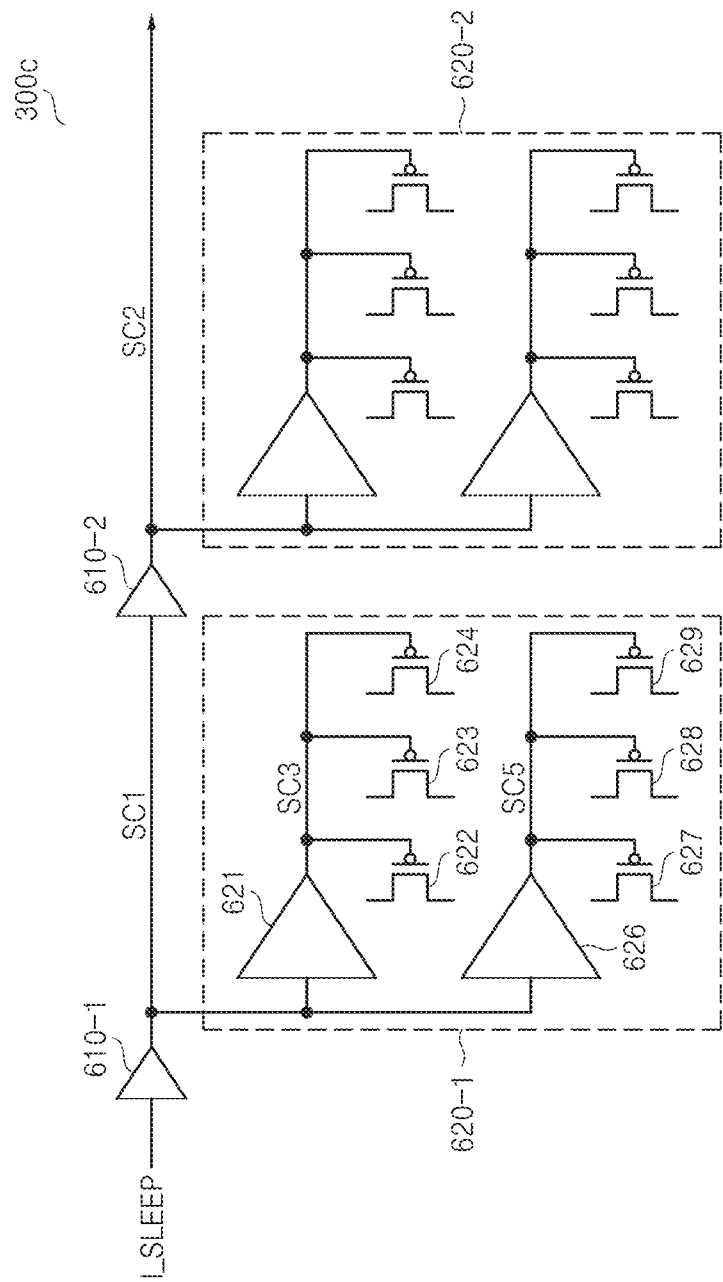
FIG. 9 is a logic diagram illustrating in yet another example the power gating circuit of FIG. 4.
Figure 10:
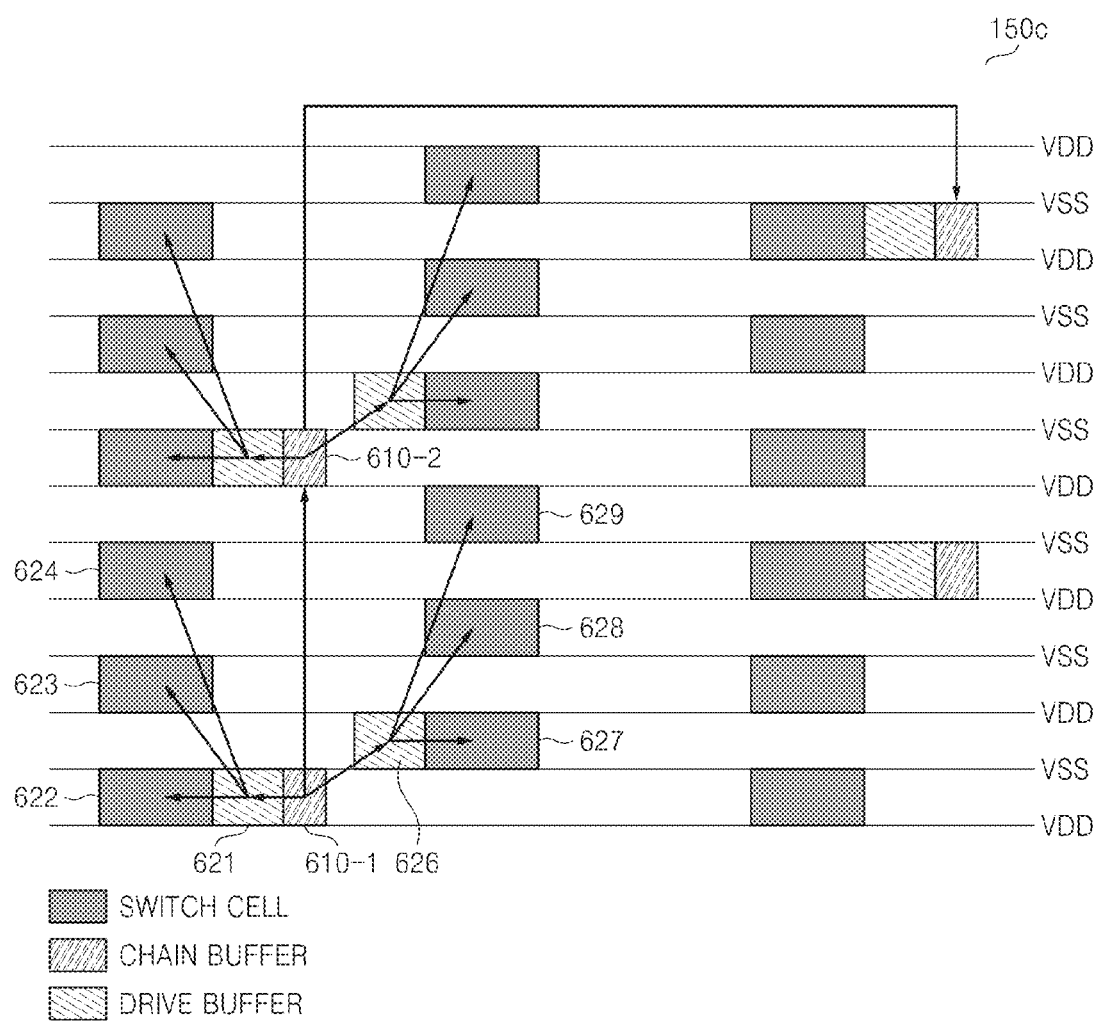
FIG. 10 is a layout diagram of an IP including the power gating circuit of FIG. 9.

FIG. 9 is a logic diagram further illustrating in yet another example (300c) the power gating circuit 300 of FIG. 4, and FIG. 10 is a layout diagram of an IP including the power gating circuit 300c of FIG. 9. The structures of the power gating circuit 300c of FIG.

9 and the IP of FIG. 10 are substantially the same as those of the power gating circuit 300b of FIG. 7 and the IP of FIG. 8, with certain exceptions described below.

Referring to FIGS. 1, 9, and 10, the power gating circuit 300c comprises a first chain buffer 610-1, a second chain buffer 610-2, a first switch block 620-1, and a second switch block 620-2.

The first chain buffer 610-1 again receives the input sleep signal (I_SLEEP) from the PMU 190 and generates a first sleep signal SC1 by buffering the input sleep signal. The first chain buffer 610-1 outputs the first sleep signal SC1 to the first switch block 620-1 and the second chain buffer 610-2.

The second chain buffer 610-2 generates a second sleep signal SC2 by buffering the first sleep signal SC1, and outputs the second sleep signal SC2 to the second switch block 620-2 and the PMU 190.

The first switch block 620-1 comprises a first drive buffer 621, a third drive buffer 626, a plurality of first switch cells 622 to 624, and a plurality of third switch cells 627 to 629. The second switch block 620-2 may have the same structure as the first switch block 620-1, or a different structure.

The first drive buffer 621 generates a third sleep signal SC3 by buffering the first sleep signal SC1, and outputs the third sleep signal SC3 to the first switch cells 622 to 624.

The third drive buffer 626 generates a fifth sleep signal SC5 by buffering the first sleep signal SC1, and outputs the fifth sleep signal SC5 to the third switch cells 627 to 629. The third drive buffer 626 may be disposed adjacent to one of the third switch cells 627 to 629.

The respective sizes of the first drive buffer 621 and third drive buffer 626 may be the same as or greater than the size of the first chain buffer 610-1.

Although FIGS. 9 and 10 illustrate an embodiment in which each of the first switch block 620-1 and the second switch block 620-2 includes two drive buffers, each of the first switch block 620-1 and the second switch block 620-2 may include three or more drive buffers.

Figure 11:
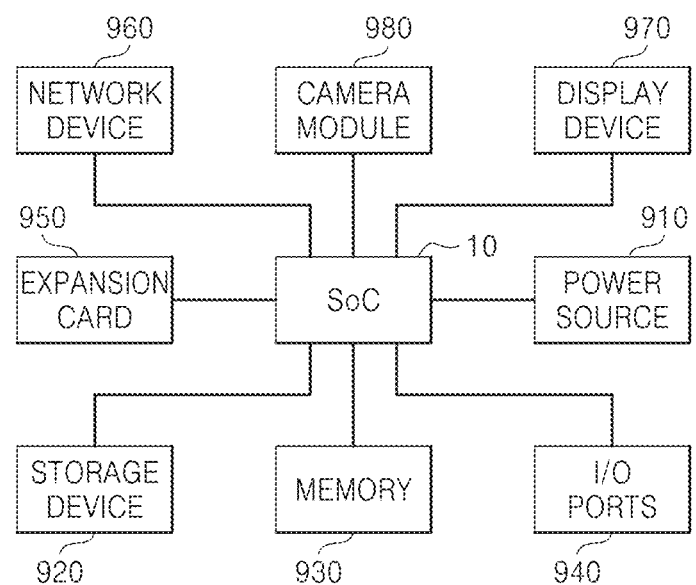
FIG. 11 is a block diagram of an electronic system including a System-on-Chip (SoC) according to certain embodiments of the inventive concept.

FIG. 11 is a block diagram illustrating an electronic system including the SoC according to certain embodiments of the inventive concept. Referring to FIG. 11, the electronic system may be implemented as a laptop computer, cellular phone, smartphone, tablet personal computer (PC), personal digital assistant (PDA), enterprise digital assistant (EDA), digital still camera, digital video camera, portable multimedia player (PMP), portable navigation device(PND), handheld game console, e(electronic)-book device, etc.

The electronic system comprises the SoC 10, a power source 910, storage device 920, memory 930, input/output (I/O) ports 940, expansion card 950, network device 960, and display device 970. In some embodiments, the electronic system may further include a camera module 980.

The SoC 10 may similar to the SoC 10 described in relation to FIG. 1. The SoC 10 may control the operation of at least one of the elements 910 through 980. The power source 910 may supply an operating voltage to at least one of the elements 10, and 910 through 980. According to some embodiments, the power source 910 may be controlled by the PMU 190 illustrated in FIG. 1.

The storage device 920 may be implemented by a hard disk drive (HDD) or a solid state drive (SSD).

The memory 930 may be implemented by a volatile or non-volatile memory. The memory 930 may correspond to the external memory 30 illustrated in FIG. 1. A memory controller (not shown) that controls a data access operation, e.g., a read operation, a write operation (or a program operation), or an erase operation, on the memory 930 may be integrated into or embedded in the SoC 10. Alternatively, the memory controller may be provided between the SoC 10 and the memory 930.

The I/O ports 940 are ports that receive data transmitted to the electronic system or transmit data from the electronic system to an external device. For instance, the I/O ports 940 may include a port connecting with a pointing device such as a computer mouse, a port connecting with a printer, and a port connecting with a USB drive.

The expansion card 950 may be implemented as a secure digital (SD) card or a multimedia card (MMC). The expansion card 950 may be a subscriber identity module (SIM) card or a universal SIM (USIM) card.

The network device 960 enables the electronic system to be connected with a wired or wireless network. The display device 970 displays data output from the storage device 920, the memory 930, the I/O ports 940, the expansion card 950, or the network device 960. The display device 970 may be the display device 20 illustrated in FIG. 1.

The camera module 980 converts optical images into electrical images.

Accordingly, the electrical images output from the camera module 980 may be stored in the storage module 920, the memory 930, or the expansion card 950. Also, the electrical images output from the camera module 980 may be displayed through the display device 970.

According to certain embodiments of the inventive concept, a power gating circuit may be provided using relatively few buffers to generate a final sleep (or acknowledge or ACK) signal while at the same time reducing the size of and leakage from the power gating circuit.

While the inventive concept has been particularly shown and described with reference to embodiments thereof, it will be understood that various changes in form and details may be made to the illustrated embodiment without departing from the scope of the following claims.

What is claimed is:

1. A power gating circuit configured to perform power gating of an element, the power gating circuit comprising:
a first chain buffer that generates a first sleep signal by buffering an input sleep signal received from a power management unit;
a first switch block including a plurality of first switch cells controlled by the first sleep signal;
a second chain buffer that generates a second sleep signal by buffering the first sleep signal; and
a second switch block including a plurality of second switch cells controlled by the second sleep signal, wherein the second sleep signal is returned to the power management unit as an acknowledge signal indicating completion of the power gating of the element;
wherein a number of the plurality of first switch cells is set according to a maximum transition time violation (MTTV) condition for the second sleep signal.

2. The power gating circuit of claim 1, wherein each of the plurality of first switch cells is a PMOS switch or an NMOS switch.

3. The power gating circuit of claim 1, wherein the power gating circuit has a grid type or ring type switch cell array structure.

4. The power gating circuit of claim 1, wherein the power management unit is disposed on a System-on-Chip (SoC) and the element is one of a central processing unit (CPU), a memory controller, and a graphics processing unit (GPU).

5. The power gating circuit of claim 4, wherein a layout implementing the SoC comprises a cell row in a gap between adjacent power rails, and the first chain buffer is disposed adjacent to one of the first switch cells in the cell row.

6. A power gating circuit configured to perform power gating of an element, the power gating circuit comprising:
a first chain buffer that generates a first sleep signal by buffering an input sleep signal received from a power management unit;
a first switch block that receives the first sleep signal;
a second chain buffer that generates a second sleep signal by buffering the first sleep signal; and
a second switch block that receive the second sleep signal, wherein the first switch block comprises:
a first drive buffer configured to generate a third sleep signal by buffering the first sleep signal and a plurality of first switch cells that receives the third sleep signal, the second switch block comprises:
a second drive buffer configured to generate a fourth sleep signal by buffering the second sleep signal and a plurality of second switch cells that receives the fourth sleep signal, and
the second sleep signal is returned to the power management unit as an acknowledge signal indicating completion of the power gating of the element.

7. The power gating circuit of claim 6, wherein a size of the first drive buffer is larger than a size of the first chain buffer.

8. The power gating circuit of claim 7, wherein the size of the first drive buffer is larger than a size of the second chain buffer.

9. The power gating circuit of claim 6, wherein a size of the first drive buffer, a size of the first chain buffer, and a number of the plurality of first switch cells are set according to a wire capacity of a wire that connects the first drive buffer with the first chain buffer.

10. The power gating circuit of claim 9, wherein the size of the first drive buffer, the size of the first chain buffer, and the number of the plurality of first switch cells is further set according to drive capacities of the plurality of first switch cells.

11. The power gating circuit of claim 6, wherein a size of the first chain buffer is set according to a number of the plurality of first switch cells.

12. The power gating circuit of claim 6, wherein each of the plurality of first switch cells and each of the plurality of second switch cells is a PMOS switch or an NMOS switch.

13. The power gating circuit of claim 6, wherein the power gating circuit has a grid type or ring type switch cell array structure.

14. The power gating circuit of claim 6, wherein a number of the plurality of first switch cells is set according to a maximum transition time violation (MTTV) condition of the second sleep signal.

15. The power gating circuit of claim 6, wherein the power management unit is disposed on a System-on-Chip (SoC) and the element is one of a central processing unit (CPU), a memory controller, and a graphics processing unit (GPU).

16. The power gating circuit of claim 6, wherein a layout implementing the SoC comprises:
a first cell row in a first gap between first adjacent power rails, the first chain buffer being disposed adjacent to the first drive buffer and the first drive buffer being disposed adjacent one of the first switch cells in the first cell row; and
a second cell row in a second gap between second adjacent power rails, the second chain buffer being disposed adjacent to the second drive buffer and the second drive buffer being disposed adjacent one of the second switch cells in the second cell row.

17. A power gating circuit configured to perform power gating of an element, the power gating circuit comprising:
a first chain buffer that generates a first sleep signal by buffering an input sleep signal received from a power management unit;
a first switch block that receives the first sleep signal;

a second chain buffer that generates a second sleep signal by buffering the first sleep signal; and
a second switch block that receives the second sleep signal, wherein the first switch block comprises:
  a first drive buffer configured to generate a third sleep signal by buffering the first sleep signal and a first plurality of first switch cells that receives the third sleep signal, and
  a third drive buffer configured to generate a fifth sleep signal by buffering the first sleep signal and a second plurality of first switch cells that receives the fifth sleep signal, the second switch block comprises:
  a second drive buffer configured to generate a second sleep signal by buffering the first sleep signal and a first plurality of second switch cells that receives the second sleep signal, and
  a fourth drive buffer configured to generate a sixth sleep signal by buffering the second sleep signal and a second plurality of second switch cells that receives the fifth sleep signal, and the second sleep signal is returned to the power management unit as an acknowledge signal indicating completion of the power gating of the element.

18. The power gating circuit of claim 17, wherein a size of the first drive buffer is larger than a size of the first chain buffer, and the size of the first drive buffer is larger than a size of the second chain buffer.

19. The power gating circuit of claim 17, wherein a size of the first drive buffer, a size of the first chain buffer, and a number of the plurality of first switch cells are set according to a wire capacity of a wire that connects the first drive buffer with the first chain buffer, and the size of the first drive buffer, the size of the first chain buffer, and the number of the plurality of first switch cells is further set according to drive capacities of the plurality of first switch cells.

* * * * *